United States Patent [19]

Arai et al.

[11] Patent Number: 4,722,441

[45] Date of Patent: Feb. 2, 1988

[54] PACKAGE STRUCTURE FOR SEMICONDUCTORS

[75] Inventors: Toshiyuki Arai, Tochigi; Keiji Hazama, Oyama; Shinichi Ota, Shimodate; Kiichi Kanamaru, Ibaraki, all of Japan

[73] Assignee: Hitachi Chemical Company, Ltd., Japan

[21] Appl. No.: 881,400

[22] Filed: Jul. 2, 1986

[51] Int. Cl.$^4$ ............................................. B65D 73/02
[52] U.S. Cl. .................... 206/328; 220/359; 220/82 A; 220/82 R
[58] Field of Search .................. 220/359, 82 A, 82 R; 206/328

[56] References Cited

U.S. PATENT DOCUMENTS

| | | | |
|---|---|---|---|
| 3,241,369 | 3/1966 | Wyzenbeek | 220/82 A |
| 3,910,448 | 10/1975 | Evans et al. | 220/359 |
| 4,109,818 | 8/1978 | Hascoe et al. | 220/359 |
| 4,245,749 | 1/1981 | Graves | 220/82 A |
| 4,327,832 | 5/1982 | deMatteo | 220/82 R |
| 4,474,306 | 10/1984 | Nakauchi et al. | 220/359 |

*Primary Examiner*—Joseph M. Moy
*Attorney, Agent, or Firm*—Antonelli, Terry & Wands

[57] ABSTRACT

A semiconductor package having a special cap shell wherein a flat molding having a window space with at least one level difference around the window space at the inside thereof is fitted with an ultraviolet-light transmissible lid at the level difference and an adhesive which has excellent sealing properties covers the periphery of the lid and the molding along and across the fitted portion so as to fix the lid to the molding without causing peeling of the adhesive.

14 Claims, 4 Drawing Figures

PACKAGE STRUCTURE FOR SEMICONDUCTORS

BACKGROUND OF THE INVENTION

This invention relates to a package made from a thermoplastic resin and having a cavity for holding semiconductor elements such as diodes and transistors and integrated circuits of these semiconductors (hereinafter simply referred to as "semiconductors"), and more particularly to a package structure suitable for erasable programmable read only memory (EPROM).

Materials typifying packages for EPROM are ceramics. In the case when CERDIP-type ceramic packages are used for packaging EPROMS, since a low-melting-point glass is used for adhering an ultraviolet-light transmissible lid, it is necessary to heat a package as a whole at a temperature higher than the melting point of glass (400° to 500° C.) at the time of sealing. When semiconductors to be included in the package have good thermal resistance, there is no problem. When the semiconductors haul poor thermal resistance, the sealing may be possible at such a high temperature however, there arise many problems including a lowered reliability, a large number of steps required for the construction, and a rise in the total cost.

The present inventors have studied the application of packages made from a thermoplastic resin and having a cavity therein for holding semiconductors proposed by the present inventors (Japanese Patent Examined Publication No. 185/83) to EPROM. That is, an EPROM was prepared by forming a window space in a flat molding 1 made from a thermoplastic resin (hereinafter referred to as "flat molding") and having a cavity and a level difference around the window space as shown in FIGS. 2A and 2B, fixing an ultraviolet-light transmissible lid 2 with an adhesive 3 to give a cap shell, interposing a memory element 7 connected to lead frame terminals 5 between a flat molding 4 and the cap shell 1 as shown in FIG. 3, and combining the cap shell and the flat molding 4 with heating. But in such a structure, the adhesive 3 was undesirably peeled off at the interfaces of the cap shell 1 and the adhesive 3 and of the lid 2 and the adhesive 3 due to shear stress caused by difference in thermal expansion coefficients of these materials, i.e., the cap shell 1, the lid 2 and the adhesive 3. There resulted many failures during a gross leak (G/L) test for evaluating sealing properties.

The thickness of adhesive 3 bearable against the shear stress generated at individual interfaces of the cap shell 1 and the adhesive 3 and the lid 2 and the adhesive 3 is calculated as 10 to 370 μm provided that the adhesive has a doubly laminated structure sandwiched by the cap shell and the lid and the elastic modulus of the adhesive is 5 to 24 kgf/cm².

In fact, in a process wherein the cap shell and the lid is bonded via the adhesive, when the elastic modulus of the adhesive is large, the adhesive is coated on the cap shell first, and the ultraviolet-light transmissible lid is pressed on the adhesive. In such a case, when the elastic modulus is relatively large, e.g. 10 to 24 kgf/cm² and the adhesive thickness is 100 μm or more, which thickness can bear the shear stress, there takes place a problem in that the adhesive flows to the ultraviolet-light transmitting portion due to flow properties of the adhesive depending on the viscosity of the adhesive.

In contrast, when the elastic modulus of the adhesive is relatively small such as 5 to 10 kgf/cm², the adhesive layer is destroyed due to the insufficient strength of the adhesive itself under very severe conditions of 2 kgf/cm² at 121° C. in an environmental test for evaluating the reliability of a manufactured EPROM.

SUMMARY OF THE INVENTION

It is an object of this invention to provide a package to include semiconductors overcoming the defects mentioned above.

This invention provides a package comprising two flat moldings made from a thermoplastic resin, at least one of said molded articles having a cavity to hold a semiconductor element which is mounted on lead frame, and said moldings putting a lead frame therebetween and integrally joined by melting under heating and pressure, characterized in that one of the flat moldings has a window space with at least one level difference around the window space at the inside thereof, an ultraviolet-light transmissible lid is fitted to the moldings at the level difference so as to close the window space, and an adhesive covers the periphery of the lid and the molding along and across the fitted portion so as to fix the lid to the molding.

DESCRIPTION OF THE PREFERRED EMBODIMENTS

Figure 1:
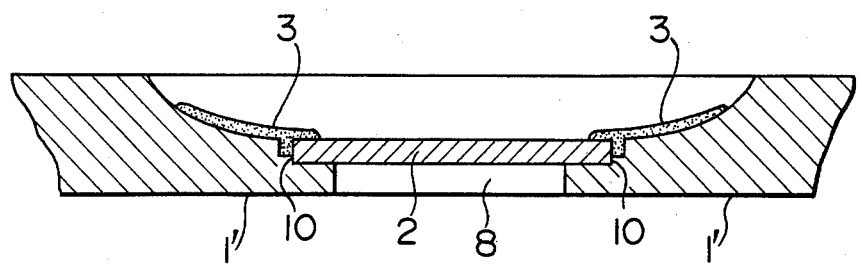
FIG. 1 is a schematic cross-sectional view of an cap shell of the package of this invention.

The semiconductor package according to this invention is characterized by the cap shell as shown in FIG. 1, wherein the upper flat molding 1' having a cavity inside thereof and a window space 8 with level differences 10 is fitted to an ultraviolet-light transmissible lid 2 and the outer periphery of the lid and the space formed by the level difference along the fitted portion are covered with an adhesive 3 with at least 100 μm or more in height so as to fix the lid 2 to the upper flat molding 1'.

In FIG. 1, two level differences 10 are formed in the flat molding 1', but one level difference may be sufficient so long as a gap can be formed between the lid and the molding at the fitted portion, and the adhesive is protuberant on the lid 2 and the upper molding. Thus, there is relaxed the shear stress which is generated by the difference in thermal expansion coefficients of the materials for the upper flat molding, the lid and the adhesive, which results in improving the sealing properties of the package without peeling off the adhesive. It is preferable that the total height of the level difference is equal to the thickness of the cap shell at the window space. The difference between the total height of the level difference and the thickness of the cap shell at the window space is permissible up to about 200 μm. A clearance of about 10 to 200 μm may be formed between the lid and the cap shell around the height of the lid. Since the size of the lid is usually about 10 mm in diameter and 0.6 mm thick, it is sufficient that the diameter of the window space is slightly smaller than that of the lid.

The thermoplastic resin for forming the upper and lower flat moldings varies depending on requirements for individual semiconductor packages. But the thermoplastic resin should have high thermal resistance (including resistance to heat distortion and resistance to thermal degradation), low moisture permeability and electrical and mechanical properties as well as good moldability.

Typical examples of the thermoplastic resin are polyphenylene oxides, polyether sulfones, polysulfones, phenoxy resins, polyacetyls, polyethylene terephthalates, polybutylene terephthalates, polyarylates, polycarbonates, polyamide resins having a low moisture absorption, polyphenylene sulfides, blends of these resins with one or more fillers such as glass fibers, etc.

As the ultraviolet-light transmissible lid, there can be used those made from borosilicate glass, sapphire glass, or the like.

As the adhesive, it is necessary to use those which are resistant to high temperatures at the time of packaging and during practical use. Examples of the adhesives are silicone resin adhesives, vinyl nitrile rubbers, polyurethane resin adhesives, epoxy resin adhesives, etc.

Figure 2A:
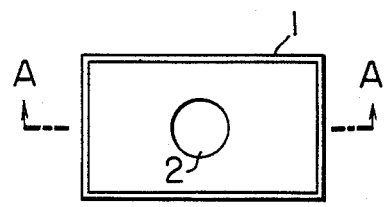
FIGS. 2A and 2B show a side view and is a cross-sectional view of an cap shell according to prior art.
Figure 2B:
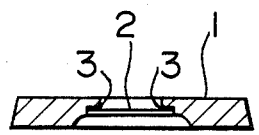
Figure 3:
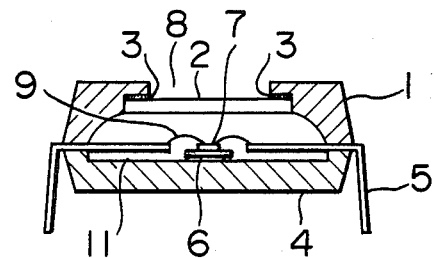
FIG. 3 is a cross-sectional view of EPROM using the cap shell of FIG. 2.

Using the special cap shell as shown in FIG. 1, semiconductor packages as shown in FIG. 3 except that the cap shell of FIG. 1 is used in place of that of FIG. 2 can be produced according to a conventional process.

This invention is illustrated by way of the following Examples.

EXAMPLES

A flat molding 1' (36 mm long, 14 mm wide and 2.2 mm thick) having a window space 8 and level differences 10 as shown in FIG. 1 was formed by using polyphenylene sulfide resin having a heat distortion temperature of 260° C. or more (ASTM D 648, 18.6 kgf/cm$^2$ load). A lid 2 made from borosilicate glass (9 mm in diameter, 0.6 mm thick) was fitted at an inside level difference as shown in FIG. 1. A silicone resin adhesive 3 (addition reaction type: modulus of elasticity 18 kgf/cm$^2$) was coated over the periphery of the lid and the fitted portion with a height of 200 μm at maximum for fixing the lid to give a cap shell. A flat molding having only a cavity as a base shell was formed by using the same resin as mentioned above. While heating joint surfaces of the cap shell 1 and the base shell 4, lead frame 5 on which an EPROM element 7 was mounted, the lead frame was inserted between the cap shell 1 and the base shell 4 to be integrally joined under pressure to give a package as shown in FIG. 3. In FIG. 3, numeral 11 denotes a cavity, numeral 6 a tab, numeral 9 gold wire, and numeral 8 window space.

The resulting semiconductor package was tested by repeatedly subjecting it to a heating and cooling cycle of from −55° C. to +150° C. for 500 times, but the sealing properties were not lowered. No abnormality was also admitted when subjected to a gross leak test. Thus, the semiconductor package obtained in this Example had sufficient reliability.

For comparison, a cap shell having a structure as shown in FIGS. 2A and 2B was prepared by using the same materials as mentioned above. A semiconductor package having the same structure as shown in FIG. 3 was prepared. When this semiconductor package was similarly subjected to the heating (150° C.) and cooling (−55° C.) cycle repeating test, the adhesive was peeled off after 2 or 3 heat cycles.

As explained above, the present invention can provide semiconductor packages having sufficient reliability in sealing properties without causing peeling of the adhesive because of relaxation of shear stress generated by difference in thermal expansion coefficients of the cap shell, lid and adhesive. Further, according to the present invention, EPROM packages, produced in prior efforts using ceramic firing processes can now be produced by using a thermoplastic resin such as described in the present specification, having a significantly reduced cost.

What is claimed is:

1. In a package comprising two flat moldings made from a thermoplastic resin, and with at least one of said moldings having a cavity for holding a semiconductor element which is mounted on a lead frame, and said moldings having inserted therebetween lead frames integrally joined with said moldings permanently by melting under heating and pressure, the improvement wherein one of said flat moldings has a window space with at least one level difference around the window space at an inside thereof, an ultraviolet-light transmissible lid is fitted to the last-mentioned molding at the level difference so as to close the window space, and an adhesive covers the periphery of the lid and the molding along and across the fitted portion so as to fix the lid to the molding.

2. A package according to claim 1, wherein the adhesive is protuberant on the lid and the fitted portion between the lid and the respective flat molding.

3. A package according to claim 1, wherein said semiconductor element comprises a memory element.

4. A package according to claim 3, wherein said memory element comprises one or more erasable programmable read-only memory (EPROM) devices.

5. A package according to claim 1, wherein said lid is a glass lid.

6. A package according to claim 1, wherein the total height of said level difference is substantially equal to the thickness of the respective flat molding at said window space.

7. A package according to claim 1, wherein the difference between the total height of said level difference and the thickness of the respective flat molding at the window space is not greater than about 200 μm.

8. A package structure for a semiconductor element comprising:
  first and second flat moldings of the thermoplastic resin type;
  at least one of said moldings having an interior region shaped such that there results an inner cavity for holding said semiconductor element which is mounted on a lead frame;
  said first and second moldings having inserted therebetween respective lead frames being permanently integrally joined together such that a single cavity is effected with said moldings;
  said first flat molding having an outer window cap shell space and including at least one level difference around the window space at the inside thereof;
  an ultraviolet-light transmissible lid being fitted to said first molding at the level difference in order to close the window space; and
  wherein an adhesive covers the periphery of the lid as well as the respective first molding area that is along and across said fitted portions in order to permanently connect the lid to the first molding.

9. A package structure according to claim 8, wherein said semiconductor element comprises a memory element.

10. A package structure according to claim 9, wherein said memory element comprises one or more erasable programmable read-only memory (EPROM) devices.

11. A package structure according to claim 8, wherein said lid is a glass lid.

12. A package structure according to claim 8, wherein the total height of said level difference is substantially equal to the thickness of the cap shell at said window space.

13. A package structure according to claim 8, wherein the difference between the total height of said level difference and the thickness of the cap shell at the window space is not greater than about 200 µm.

14. A package structure according to claim 8, wherein the adhesive is protuberant on the lid and the fitted portions between the lid and said first flat molding.

* * * * *